(12) United States Patent
Chudzik et al.

(10) Patent No.: US 7,754,594 B1
(45) Date of Patent: Jul. 13, 2010

(54) METHOD FOR TUNING THE THRESHOLD VOLTAGE OF A METAL GATE AND HIGH-K DEVICE

(75) Inventors: Michael P Chudzik, Danbury, CT (US); Michael A Gribelyuk, Stamford, CT (US); Rashmi Jha, Toledo, OH (US); Renee T Mo, Briarcliff Manor, NY (US); Naim Moumen, Walden, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/359,434

(22) Filed: Jan. 26, 2009

(51) Int. Cl.
    *H01L 21/3205* (2006.01)
(52) U.S. Cl. .............................. 438/585; 257/E21.159; 257/E29.158
(58) Field of Classification Search ................ 438/585; 257/E21.159, E29.158
See application file for complete search history.

(56) References Cited

U.S. PATENT DOCUMENTS

| 7,378,713 | B2 * | 5/2008 | Hsu et al. ............... 257/369 |
| 2005/0136605 | A1 * | 6/2005 | Murto et al. ............. 438/303 |
| 2006/0289903 | A1 * | 12/2006 | Andreoni et al. .......... 257/287 |
| 2008/0001237 | A1 * | 1/2008 | Chang et al. ............. 257/411 |
| 2009/0008725 | A1 * | 1/2009 | Guha et al. .............. 257/411 |

OTHER PUBLICATIONS

V. Narayanan, et al, "Band-Edge High-Performance High-K/Metal Gate n-MOSFETs using Cap Layers . . . ", 2006 Symposium on VLSI Technology Digest of Technical Papers, IEEE 2006.

* cited by examiner

*Primary Examiner*—W. David Coleman
*Assistant Examiner*—Christine Enad
(74) *Attorney, Agent, or Firm*—Joseph Petrokaitis

(57) ABSTRACT

A metal gate and high-k dielectric device includes a substrate, an interfacial layer on top of the substrate, a high-k dielectric layer on top of the interfacial layer, a metal film on top of the high-k dielectric layer, a cap layer on top of the metal film and a metal gate layer on top of the cap layer. The thickness of the metal film and the thickness of the cap layer are tuned such that a target concentration of a cap layer material is present at an interface of the metal film and the high-k dielectric layer.

23 Claims, 3 Drawing Sheets

METHOD FOR TUNING THE THRESHOLD VOLTAGE OF A METAL GATE AND HIGH-K DEVICE

BACKGROUND OF THE INVENTION

The present invention relates generally to a semiconductor device and method of forming the same and, more specifically, to metal gate and high dielectric constant (high-k) devices.

In devices with poly-Si gates, achieving a desired work function of a gate material for n-FET and p-FET CMOS devices to meet an operating voltage requirement is achieved by heavy doping of poly-Si, an acceptor dopant for p-FET and a donor for n-FET. In a high-k dielectric/metal gate stack, different metal gate materials which possess the desired work function are used for n-FET and p-FET devices. Since the work function of the metal gate material depends on the high-k gate dielectric and processing conditions, selection of suitable gate materials presents a challenge for process integration. Metal gate work function may also be adjusted by placing cap layers between the metal gate and the high-k gate dielectric. The position of the cap layers after thermal processing determines the work function and threshold voltage (Vt) of the device. Diffusion of the cap layer through the thin high-k gate dielectric into an interfacial layer during anneals causes degradation of carrier mobility. Attempts to limit diffusion by nitridation of the high-k gate dielectric had limited success.

SUMMARY OF THE INVENTION

In a first aspect of the invention, a method of forming a device includes depositing an interfacial layer on top of a substrate. The method includes depositing a high-k dielectric layer on top of the interfacial layer. The method includes depositing a metal film on top of the high-k dielectric layer. The method includes depositing a cap layer on top of the metal film. The method further includes depositing a metal gate layer on top of the cap layer. The method also includes performing an activation anneal.

In a further aspect of the invention, a device includes a substrate. The device includes an interfacial layer on top of the substrate. The device includes a high-k dielectric layer on top of the interfacial layer. The device includes a metal film on top of the high-k dielectric layer. The device further includes a cap layer on top of the metal film. The device also includes a metal gate layer on top of the cap layer.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

Figure 1:
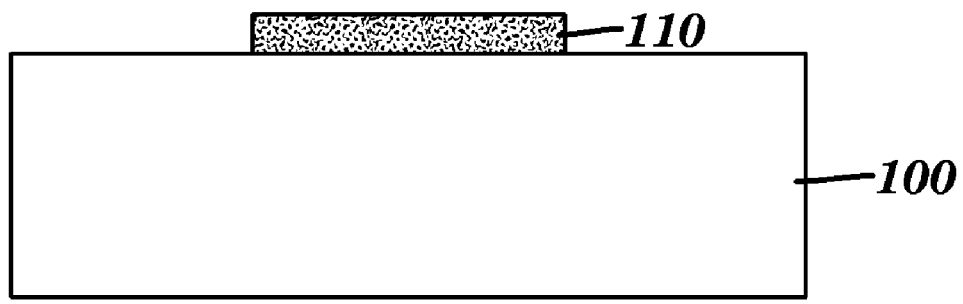
FIG. 1 shows a starting structure and processing steps in accordance with an embodiment of the invention.

FIG. 1 shows a starting structure and processing steps in accordance with an embodiment of the invention. A substrate 100 is cleaned by conventional processes. Substrate 100 may be a Si wafer. An interfacial layer 110 is formed on substrate 100. Interfacial layer 110 may be formed by thermal oxidation or any known or later developed processes. Interfacial layer 110 may include, but is not limited to: oxide, nitride and oxynitride. Interfacial layer 110 may be formed with or without subsequent nitridation. Interfacial layer 110 may have a thickness of approximately 1 nm to 7 nm.

Figure 2:
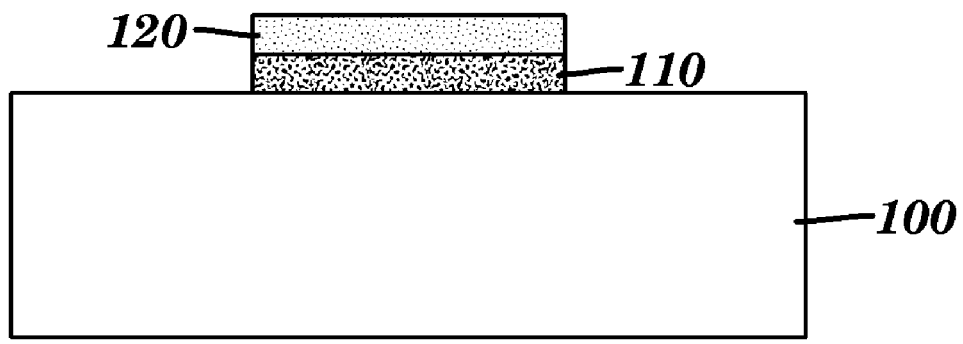
FIGS. 2-4 show processing steps and intermediate structures in accordance with an embodiment of the invention.

Referring to FIG. 2, a high-k dielectric layer 120 is deposited on top of interfacial layer 110. High-k dielectric layer 120 may be deposited by thermal oxidation or any known or later developed processes. High-k dielectric layer 120 may include, but is not limited to: zirconium oxide (ZrO2), hafnium oxide (HfO2), zirconium silicate (ZrSiO4) and hafnium silicate (HfSiO4). High-k dielectric layer 120 may be approximately 1 nm to 7 nm thick.

Figure 3:
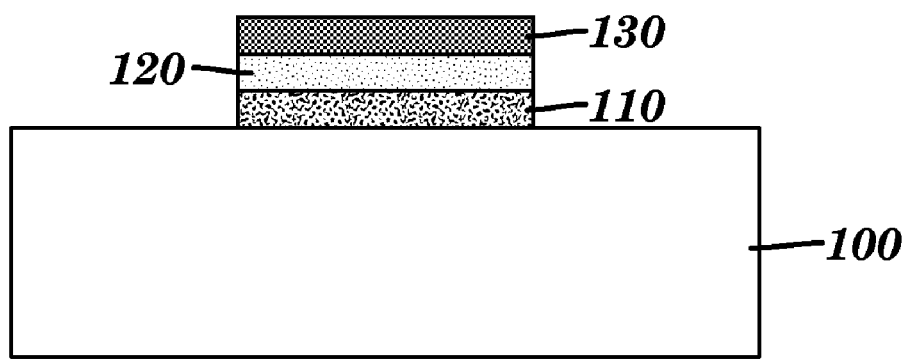

Referring to FIG. 3, a metal film 130 is deposited on top of high-k dielectric layer 120. Metal film 130 may be deposited by physical vapor deposition (PVD), metalorganic chemical vapor deposition (MOCVD), molecular beam epitaxy (MBE) or any known or later developed processes. Metal film 130 may be approximately 0.1 nm to 10 nm thick. Metal film 130 may include, but is not limited to: ruthenium (Ru), tungsten (W), tantalum (Ta), titanium (Ti), tantalum nitride (TaN) and titanium nitride (TiN).

Figure 4:
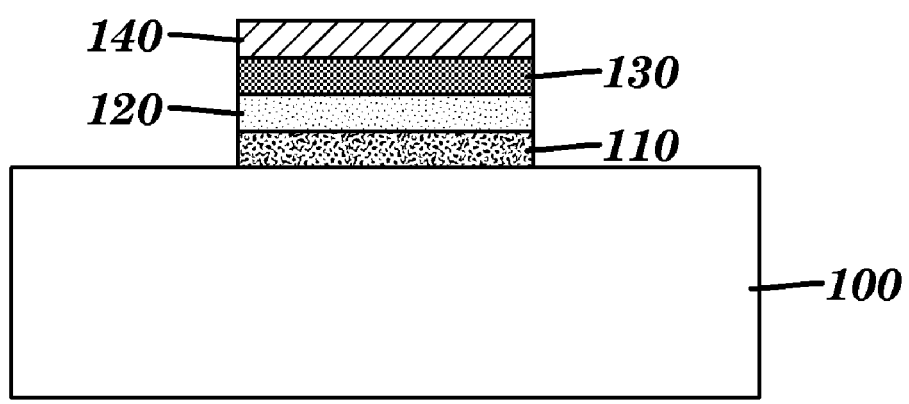

Referring to FIG. 4, a cap layer 140 is deposited on top of metal film 130. Cap layer 140 may be deposited by physical vapor deposition (PVD), metalorganic chemical vapor deposition (MOCVD), molecular beam epitaxy (MBE) or any known or later developed processes. Cap layer 140 may have a thickness of approximately 0.1 nm to 5 nm. Cap layer 140 may include, but is not limited to metal oxides (MOx), metal nitrides (MNx) and pure metals. MOx may include, but is not limited to: tantalum oxide (TaOx) and titanium oxide (TiOx). MNx may include, but is not limited to tantalum nitride (TaNx) and titanium nitride (TiNx). Pure metals may include, but are not limited to: tungsten (W), tantalum (Ta) and titanium (Ti).

Figure 5:
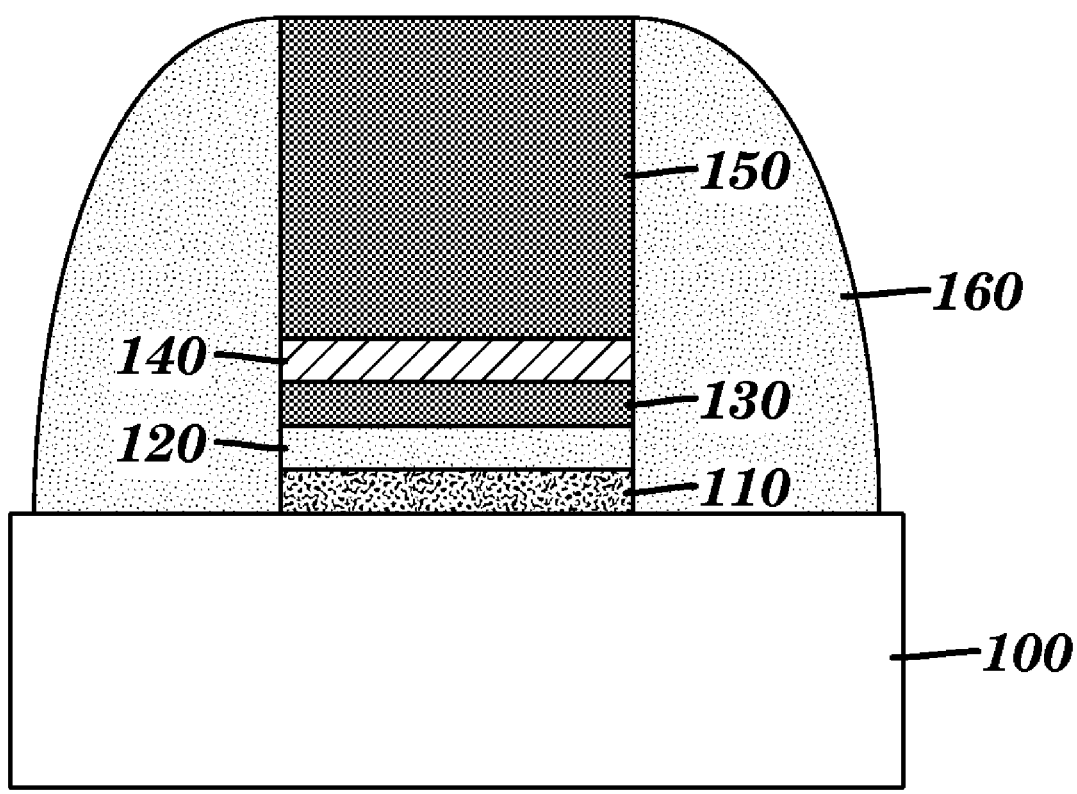
FIG. 5 shows processing steps and a final structure in accordance with an embodiment of the invention.

FIG. 5 shows processing steps and a final structure in accordance with an embodiment of the invention. A metal gate layer 150 is deposited on top of cap layer 140. Metal gate layer 150 may be deposited by physical vapor deposition (PVD), metalorganic chemical vapor deposition (MOCVD), molecular beam epitaxy (MBE) or any known or later developed processes. Metal gate layer 150 has a thickness of approximately 0.1 nm to 10 nm. Metal film 130 and metal gate layer 150 may be the same or different. A gate is comprised of metal film 130, cap layer 140 and metal gate layer 150. Poly-Si may be deposited on top of the gate (not shown). The gate may be patterned. Spacers 160 may be formed along with active device regions (not shown). Thermal processing leads to diffusion of cap layer 140. The optimum location of species of a cap layer with respect to gate dielectric leads to setting up a desired work function of the metal gate and thus desired threshold voltage (Vt) of the device without compromising carrier mobility.

The thickness of metal film 130 and cap layer 140 may be tuned so that a target concentration of a cap layer material is present at an interface of metal film 130 and high-k dielectric layer 120 after activation anneal without allowing the cap layer material to diffuse close to the Si in substrate 100. The target concentration may be approximately 0.1% to 10%. The former will lead to desired threshold voltage (Vt). The latter will eliminate degradation of carrier mobility. Additionally, placing the cap layer 140 away from the interface of metal film 130 and high-k dielectric layer 120 allows for the deposition of thicker cap layers then currently employed, making the process more manufacturable.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a device, comprising:
   depositing an interfacial layer on top of a substrate;
   depositing a high-k dielectric layer on top of the interfacial layer;
   depositing a metal film on top of the high-k dielectric layer;
   depositing a cap layer on top of the metal film;
   depositing a metal gate layer on top of the cap layer; and
   performing an activation anneal, wherein the thickness of the metal film and the thickness of the cap layer are tuned such that a target concentration of a cap layer material is present at an interface of the metal film and the high-k dielectric layer after the performing step without allowing the cap layer material to diffuse close to the substrate, wherein the target concentration is approximately 0.1% to 10%.

2. A device, comprising:
   a substrate;
   an interfacial layer on top of the substrate;
   a high-k dielectric layer on top of the interfacial layer;
   a metal film on top of the high-k dielectric layer;
   a cap layer on top of the metal film; and
   a metal gate layer on top of the cap layer, wherein a target concentration of a cap layer material is present at an interface of the metal film and the high-k dielectric layer, wherein the target concentration is approximately 0.1% to 10%.

3. A method according to claim 1, wherein the interfacial layer is deposited by thermal oxidation.

4. A method according to claim 1, wherein the high-k dielectric layer is deposited by thermal oxidation.

5. A method according to claim 1, wherein the metal film has thickness of approximately 0.1 nm to 10 nm.

6. A method according to claim 1, wherein the cap layer is deposited on top of the metal film by physical vapor deposition (PVD), metalorganic chemical vapor deposition (MOCVD) or molecular beam epitaxy (MBE).

7. A method according to claim 1, wherein the metal gate layer is deposited by physical vapor deposition (PVD), metalorganic chemical vapor deposition (MOCVD) or molecular beam epitaxy (MBE).

8. A method according to claim 3, wherein the interfacial layer is selected from the group consisting of: oxide, nitride and oxynitride.

9. A method according to claim 4, wherein the high-k dielectric layer is selected from the group consisting of: zirconium oxide (ZrO2), hafnium oxide (HfO2), zirconium silicate (ZrSiO4) and hafnium silicate (HfSiO4).

10. A method according to claim 5, wherein the metal film is deposited by physical vapor deposition (PVD), metalorganic chemical vapor deposition (MOCVD) or molecular beam epitaxy (MBE).

11. A method according to claim 6, wherein the cap layer is selected from the group consisting of: metal oxides (MOx), metal nitrides (MNx) and pure metals.

12. A method according to claim 7, wherein the metal gate layer has thickness of approximately 0.1 nm to 10 nm.

13. A method according to claim 8, wherein the interfacial layer has a thickness of approximately 1 nm to 7 nm.

14. A method according to claim 9, wherein the high-k dielectric layer has a thickness of approximately 1 nm to 7 nm.

15. A method according to claim 10, wherein the metal film is selected from the group consisting of: ruthenium (Ru), tungsten (W), tantalum (Ta), titanium (Ti), tantalum nitride (TaN) and titanium nitride (TiN).

16. A method according to claim 11, wherein the cap layer has a thickness of approximately 0.1 nm to 5 nm.

17. A method according to claim 12, wherein the metal film and the metal gate layer are the same material.

18. A device according to claim 2, wherein the interfacial layer is selected from the group consisting of: oxide, nitride and oxynitride.

19. A device according to claim 2, wherein the high-k dielectric layer is selected from the group consisting of: zirconium oxide (ZrO2), hafnium oxide (HfO2), zirconium silicate (ZrSiO4) and hafnium silicate (HfSiO4).

20. A device according to claim 2, wherein the metal film is selected from the group consisting of: ruthenium (Ru), tungsten (W), tantalum (Ta), titanium (Ti), tantalum nitride (TaN) and titanium nitride (TiN).

21. A device according to claim 2, wherein the cap layer is selected from the group consisting of: metal oxides (MOx), metal nitrides (MNx) and pure metals.

22. A device according to claim 2, wherein metal film and the metal gate layer are the same material.

23. A device according to claim 2, wherein the interfacial layer has a thickness of approximately 1 nm to 7 nm, the high-k dielectric layer has a thickness of approximately 1 nm to 7 nm, the metal film has a thickness of approximately 0.1 nm to 10 nm, the cap layer has a thickness of approximately 0.1 nm to 5 nm and the metal gate layer has thickness of approximately 0.1 nm to 10 nm.

* * * * *